(12) United States Patent
Kita

(10) Patent No.: US 10,715,753 B2
(45) Date of Patent: Jul. 14, 2020

(54) SOLID-STATE IMAGE PICKUP ELEMENT AND ELECTRONIC APPARATUS

(71) Applicant: SONY CORPORATION, Tokyo (JP)

(72) Inventor: Mitsuaki Kita, Kanagawa (JP)

(73) Assignee: SONY CORPORATION, Toyko (JP)

(*) Notice: Subject to any disclaimer, the term of this patent is extended or adjusted under 35 U.S.C. 154(b) by 0 days.

(21) Appl. No.: 16/097,629

(22) PCT Filed: Apr. 27, 2017

(86) PCT No.: PCT/JP2017/016663
§ 371 (c)(1),
(2) Date: Oct. 30, 2018

(87) PCT Pub. No.: WO2017/195613
PCT Pub. Date: Nov. 16, 2017

(65) Prior Publication Data
US 2019/0141256 A1    May 9, 2019

(30) Foreign Application Priority Data
May 11, 2016    (JP) .................................. 2016-095427

(51) Int. Cl.
*H04N 5/369*    (2011.01)
*H04N 5/378*    (2011.01)
*H04N 5/232*    (2006.01)
*H04N 5/3745*   (2011.01)
*H04N 9/04*     (2006.01)

(52) U.S. Cl.
CPC ... *H04N 5/36961* (2018.08); *H04N 5/232122* (2018.08); *H04N 5/378* (2013.01);
(Continued)

(58) Field of Classification Search
CPC ......... H04N 5/23212; H04N 5/232122; H04N 5/3696; H04N 5/36961; H04N 5/378;
(Continued)

(56) References Cited

U.S. PATENT DOCUMENTS

2006/0023109 A1*  2/2006  Mabuchi ................. H01L 24/17
                                                    348/340
2012/0188425 A1*  7/2012  Kita ..................... H04N 5/23212
                                                    348/294
(Continued)

FOREIGN PATENT DOCUMENTS

CN          104081245 A       10/2014
CN          104937923 A        9/2015
(Continued)

OTHER PUBLICATIONS

International Search Report and Written Opinion of PCT Application No. PCT/JP2017/016663, dated Aug. 1, 2017, 10 pages of ISRWO.

*Primary Examiner* — Daniel M Pasiewicz
(74) *Attorney, Agent, or Firm* — Chip Law Group

(57) ABSTRACT

The present disclosure relates to a solid-state image pickup element and an electronic apparatus each of which enables a phase difference in an arbitrary direction to be properly detected.

A solid-state image pickup element as a first aspect of the present disclosure includes a pixel array, and a plurality of AD conversion portions. The pixel array is partitioned into a plurality of pixel blocks each including a normal pixel and a pixel for phase difference detection. The plurality of AD conversion portions correspond to the respective plurality of pixel blocks, and AD-convert pixel signals based on a plurality of pixels included in the corresponding pixel block. In this case, the pixel for phase difference detection included in one pixel block of the plurality of pixel blocks, and the pixel for phase difference detection included in the other pixel block of the plurality of pixel blocks are arranged in positions corresponding to each other. The present disclosure, for example, can be applied to a CMOS image sensor.

14 Claims, 15 Drawing Sheets

(52) U.S. Cl.
CPC ......... *H04N 5/379* (2018.08); *H04N 5/37455* (2013.01); *H04N 9/04553* (2018.08); *H04N 9/04555* (2018.08); *H04N 9/04557* (2018.08); *H04N 9/04559* (2018.08)

(58) Field of Classification Search
CPC ............... H04N 5/379; H04N 9/04553; H04N 9/04555; H04N 9/04557; H04N 9/04559
See application file for complete search history.

(56) References Cited

U.S. PATENT DOCUMENTS

| | | | |
|---|---|---|---|
| 2013/0107067 A1* | 5/2013 | Miyakoshi | H04N 5/23212 348/208.5 |
| 2013/0182173 A1 | 7/2013 | Murata | |
| 2014/0146208 A1* | 5/2014 | Nakajima | H04N 5/3696 348/294 |
| 2015/0002715 A1* | 1/2015 | Ise | H04N 5/23212 348/308 |
| 2015/0381915 A1 | 12/2015 | Mabuchi | |
| 2016/0327771 A1 | 11/2016 | Inoue et al. | |
| 2017/0180663 A1* | 6/2017 | Mabuchi | H04N 5/378 |

FOREIGN PATENT DOCUMENTS

| | | |
|---|---|---|
| EP | 2804035 A1 | 11/2014 |
| JP | 2013-145292 A | 7/2013 |
| JP | 2014-155175 A | 8/2014 |
| WO | 2013/105481 A1 | 7/2013 |
| WO | 2014/125785 A1 | 8/2014 |
| WO | 2015/122061 A1 | 8/2015 |

* cited by examiner

SOLID-STATE IMAGE PICKUP ELEMENT AND ELECTRONIC APPARATUS

CROSS REFERENCE TO RELATED APPLICATIONS

This application is a U.S. National Phase of International Patent Application No. PCT/JP2017/016663 filed on Apr. 27, 2017, which claims priority benefit of Japanese Patent Application No. JP 2016-095427 filed in the Japan Patent Office on May 11, 2016. Each of the above-referenced applications is hereby incorporated herein by reference in its entirety.

TECHNICAL FIELD

The present disclosure relates to a solid-state image pickup element and an electronic apparatus, and more particularly to a solid-state image pickup element and an electronic apparatus each of which is suitable for being used in phase difference detection AF (auto focus).

BACKGROUND ART

Heretofore, phase difference detection AF has been known as an AF method which is adopted in a digital camera or the like. In the phase difference detection AF, a distance to a subject is obtained on the basis of correlation calculation about pixel signals obtained from pair of pixels for phase difference detection which are arranged on a solid-state image pickup element such as a CMOS image sensor, and focus is controlled on the basis of the resulting distance.

In addition, heretofore, some solid-state image pickup elements have adopted a column ADC system (referred to as a line sequential ADC system as well) in which in converting analog electrical signals read out from the respective pixels into digital signals, the pixels belonging to the same column hold an ADC (Analog Digital Converter) in common, and a plurality of ADCs corresponding to the respective columns is operated in parallel to each other.

In the column ADC system, although in a stage in which the AF is carried out, the exposure and the reading are carried out at the same timing for the pixels (including the pixels for phase difference detection) arranged in the same row, the exposure and the reading for the rows are sequentially carried out. Therefore, in the case where the pixels different in rows from each other in which they are arranged are compared with each other, the timings of the exposure and the reading shall be shifted.

An area ADC system is also present with which a difference in timing of the exposure and the reading can be shortened as compared with the column ADC system described above. In the area ADC system, all the pixels are divided into pixel blocks each having a size of several pixels×several pixels, the ADC is shared in units of the pixel blocks, and a plurality of ADCs each corresponding to each of the pixel blocks, is operated in parallel to one another (for example, refer to PTL 1).

CITATION LIST

Patent Literature

[PTL 1]
JP 2009-177207A

SUMMARY

Technical Problem

As described above, in case of the area ADC system, the difference between the timings of the exposure and the reading for the pixels can be shortened as compared with case of the column ADC system. However, in the past solid-state image pickup element adopting the area ADC system, arrangement of the pixels for phase difference detection used for the phase difference detection AF was not taken into consideration.

The present disclosure has been made in the light of such a situation, an area ADC system is adopted in a solid-state image pickup element in which pixels for phase difference detection are arranged, thereby enabling a phase difference in an arbitrary direction to be properly detected.

Solution to Problem

A solid-state image pickup element as a first aspect of the present disclosure is provided with a pixel array partitioned into a plurality of pixel blocks each including a normal pixel and a pixel for phase difference detection, and a plurality of AD conversion portions that correspond to the respective plurality of pixel blocks and AD-convert pixel signals based on a plurality of pixels included in the corresponding pixel block, in which the pixel for phase difference detection included in one pixel block of the plurality of pixel blocks, and the pixel for phase difference detection included in the other pixel block of the plurality of pixel blocks are arranged in positions corresponding to each other.

The solid-state image pickup element as the first aspect of the present disclosure can be further provided with a reading control portion configured to control processing for reading out the pixel signals from the plurality of pixels included in the pixel block, and supplying the pixel signals to the corresponding AD conversion portions.

The reading control portion can control the reading of the pixel signals in order responding to the arrangement in the pixel block without distinguishing the normal pixel and the pixel for phase difference detection from each other.

The reading control portion can, after the normal pixel and the pixel for phase difference detection are distinguished from each other, and the reading of the pixel signals is controlled in order responding to the arrangement in the pixel block for one of the normal pixel or the pixel for phase difference detection, control the reading of the pixel signals in order corresponding to the arrangement in the pixel block for one of the normal pixel or the pixel for phase difference detection.

The reading control portion can read a plurality of pixels included in the one pixel block in order corresponding to a plurality of pixels included in the other pixel block.

The pixel for phase difference detection included in one pixel block of the plurality of pixel blocks, and the pixel for phase difference detection included in the other pixel block of the plurality of pixel blocks can be arranged in positions common between the respective pixel blocks.

Order in accordance with which the pixel signals based on a plurality of pixels in the pixel block are AD-converted can be common among the respective pixel blocks.

Order in accordance with which the pixel signals based on a plurality of pixels in the pixel block are AD-converted can differ depending on the pixel blocks.

The pixel for phase difference detection partitioned in one pixel block of the plurality of pixel blocks, and the pixel for phase difference detection partitioned in the other pixel block of the plurality of pixel blocks can be arranged in different positions in the respective pixel blocks. In addition, order in accordance with which the pixel signals based on the pixel for phase difference detection in the respective pixel blocks are AD-converted can be common among the respective pixel blocks.

The pixel array can be formed in a first substrate, and the plurality of AD conversion portions can be formed on a second substrate the first substrate and which are laminated on each other.

The pixel for phase difference detection can produce a pixel signal used in the control for phase difference detection auto focus.

The pixels for phase difference detection in the pixel block can be arranged in a transverse direction.

The pixels for phase difference detection in the pixel block can be arranged in a longitudinal direction.

The pixels for phase difference detection in the pixel block can be arranged in an oblique direction.

The pixel for phase difference detection can serve as the normal pixel as well.

An electronic apparatus as a second aspect of the present disclosure is an electronic apparatus equipped with a solid-state image pickup element. The solid-state image pickup element is provided with a pixel array partitioned into a plurality of pixel blocks each including a normal pixel and a pixel for phase difference detection, and a plurality of AD conversion portions that correspond to the respective plurality of pixel blocks and AD-convert pixel signals based on a plurality of pixels included in the corresponding pixel block, in which the pixel for phase difference detection included in one pixel block of the plurality of pixel blocks, and the pixel for phase difference detection included in the other pixel block of the plurality of pixel blocks are arranged in positions corresponding to each other.

Advantageous Effect of Invention

According to the first and second aspects of the present disclosure, the phase difference in an arbitrary direction can be properly detected, and the accuracy of the auto focus can be increased.

DESCRIPTION OF EMBODIMENTS

Hereinafter, the best modes for carrying out the present disclosure (hereinafter, referred to as embodiments) will be described in detail with reference to the drawings.

<Configuration Example of Solid-State Image Pickup Element as Embodiment of the Present Disclosure>

Figure 1:
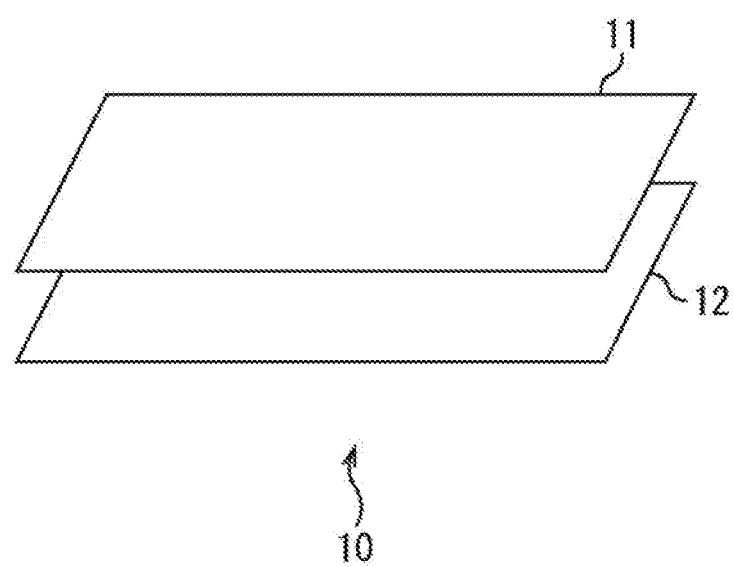
FIG. 1 is a view depicting an example of a configuration of substrates of a solid-state image pickup element to which the present disclosure is applied.

FIG. 1 is an example of a configuration of a solid-state image pickup element as an embodiment of the present disclosure.

The solid-state image pickup element 10 includes two sheets of substrates: an upper substrate 11; and a lower substrate 12. Corresponding portions of the upper substrate 11 and the lower substrate 12 are electrically connected to each other by Cu—Cu joining, so that the upper substrate 11 and the lower substrate 12 are laminated on each other.

Figure 2A:
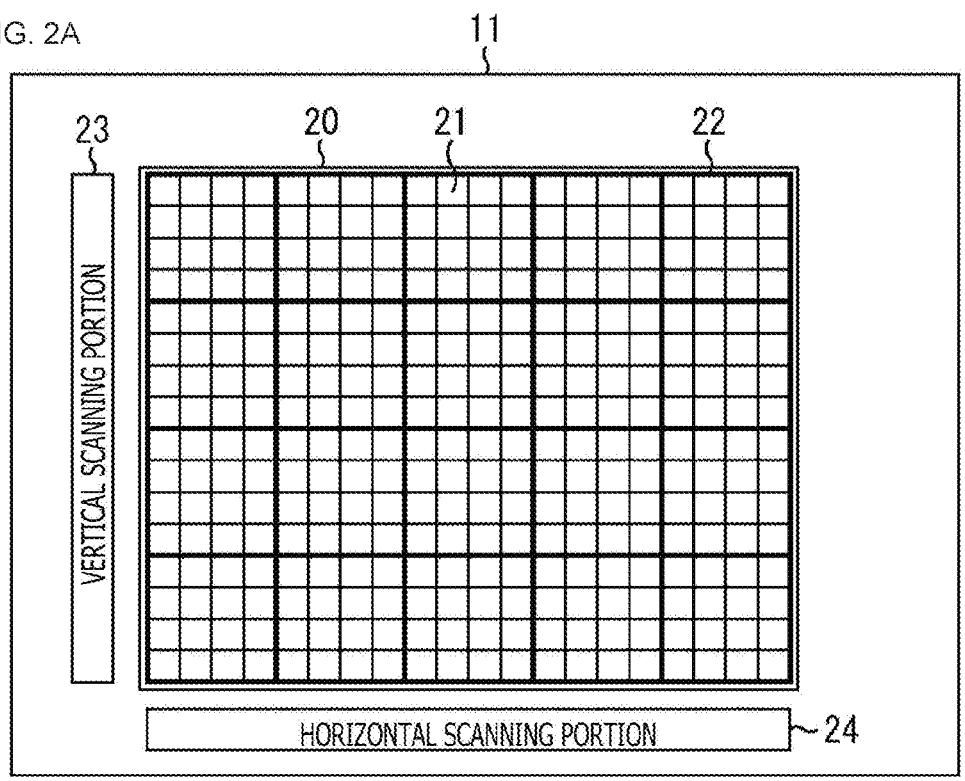
FIGS. 2A and 2B are block diagrams depicting an example of a configuration of an upper substrate and a lower substrate of FIGS. 2A and 2B.
Figure 2B:
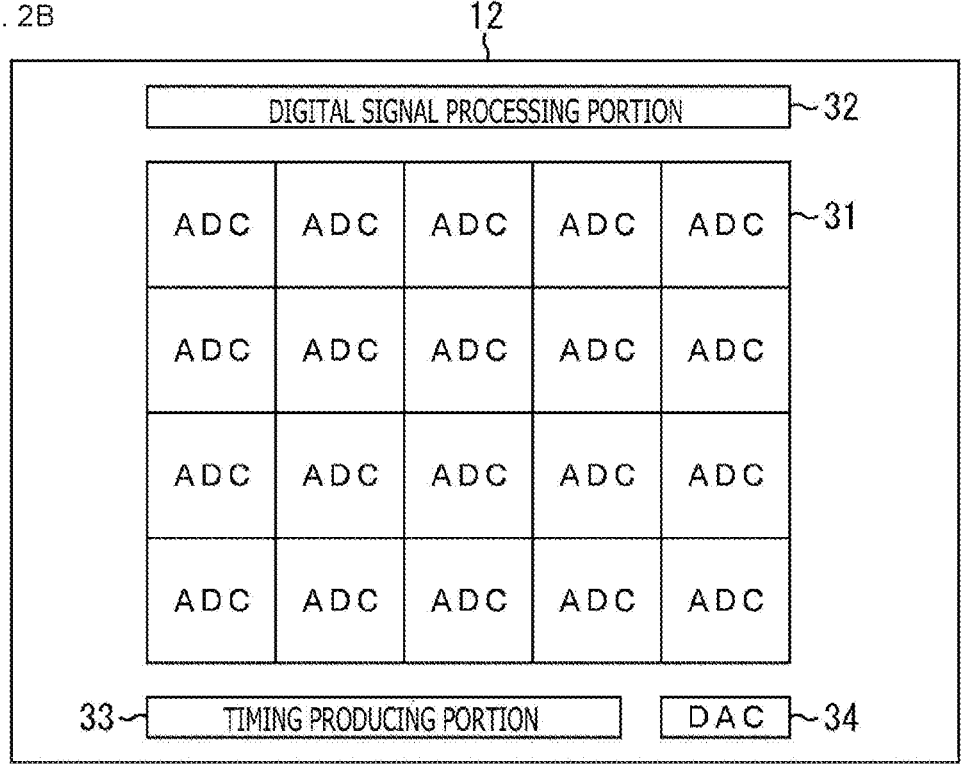

FIGS. 2A and 2B represent an outline of the upper substrate 11 and the lower substrate 12, and respective circuit configurations.

As depicted in FIG. 2A, a pixel array 20, a vertical scanning portion 23, and a horizontal scanning portion 24 are provided in the upper substrate 11. The pixel array 20 includes a plurality of pixels 21 arranged in a matrix. The pixels 21 are partitioned into pixel blocks 22 each having a predetermined size. It should be noted that as will be described in detail later, a normal pixel which outputs a pixel signal used to produce image data, and a pixel for phase difference detection which outputs a pixel signal used in phase difference detection AF are included in the pixels 21. In addition, the pixel for phase difference detection serving as the normal pixel as well may be present.

Although in FIG. 2A, the pixel block 22 is drawn so as to include 4×4 pixels, the number of pixels configuring the pixel block 22, and each of shapes of the pixels are arbitrary, and thus the partition form of the pixel block 22 is by no means limited to the 4×4 pixels. In an example which will be described later, the pixel block 22 includes 12×12 pixels. In addition, the number of pixels in the longitudinal direction, and the number of pixels in the transverse direction in the pixels configuring the pixel block are by no means limited to be equal to each other. Thus, one pixel block, for example, may include the 4×6 pixels or the like.

The pixel 21 generates electric charges responding to incident light through photoelectric conversion processing to accumulate therein the resulting electric charges and transfers a pixel signal responding to the accumulated electric charges to an ADC 31 of the lower substrate 12 at a scanning timing based on the control from the vertical scanning portion 23 and the horizontal scanning portion 24. The vertical scanning portion 23 controls the scanning timing in the vertical direction of the pixels 21 configuring the pixel array 20. The horizontal scanning portion 24 controls the scanning timing in the horizontal direction of the pixels 21 configuring the pixel array 20.

As depicted in FIG. 2B, a plurality of ADCs 31 each corresponding to each of the pixel blocks 22 of the upper substrate 11, a digital signal processing portion 32, a timing producing portion 33, and a DAC 34 are provided in the lower substrate 12.

The ADC 31 is equal in size to the pixel block 22, and converts analog signals which are sequentially transferred thereto from a plurality of pixels 21 belonging to the corresponding pixel block 22 into digital signals. The digital signal processing portion 32 reads out the pixel signals after the digital conversion from the individual ADCs 31, and executes predetermined signal processing for the pixel signals thus read out. The timing producing portion 33 produces and outputs a control signal in accordance with which the vertical scanning portion 23 and horizontal scanning portion 24 for controlling the scanning timing for the pixels 21 in the pixel array portion 20 are controlled. In addition, the timing producing portion 33 notifies the DAC 34 of a reference voltage value. The DAC 34 DA-converts the reference voltage value notified from the timing producing portion 33, and supplies the resulting $R_{amp}$ to the ADC 31.

In the case where the image capturing is carried out in the solid-state image pickup element 10 in which the upper substrate 11 and lower substrate 12 depicted in FIGS. 2A and 2B are laminated on each other, the control signal is outputted from the timing producing portion 33 to each of the vertical scanning portion 23 and the horizontal scanning portion 24. In accordance with the control signal, each of the vertical scanning portion 23 and the horizontal scanning portion 24 scans the pixels 21, which are partitioned into the pixel blocks 22, in predetermined order.

The analog pixel signal read out from the pixel 21 is supplied to the corresponding ADC 31. In the ADC 31, the analog pixel signal is digitally converted, and the resulting digital pixel signal is then outputted to the digital signal processing portion 32 (details of the ADC 31 will be described in detail later with reference to FIG. 3). The digital signal processing portion 32 executes predetermined signal processing for the digital pixel signal, and the pixel signal as this processing result is then outputted from the solid-state image pickup element 10 to a subsequent stage.

Incidentally, in the case where the pixels 21 are scanned, not only the normal pixel and the pixel for phase difference detection can be scanned in order corresponding to the positions thereof without distinguishing the normal pixel and the pixel for phase difference detection from each other, but also the normal pixel and the pixel for phase difference detection can be scanned so as to be distinguished from each other. Specifically, each of the vertical scanning portion 23 and the horizontal scanning portion 24 control the scanning timing so as to distinguish the normal pixel and the pixel for phase difference detection from each other, whereby, for example, after all the pixels for phase difference detection are early scanned, all the remaining normal pixels can be scanned. Contrary to this, after all the normal pixels are early scanned, all the remaining pixels for phase difference detection can be scanned.

Figure 3:
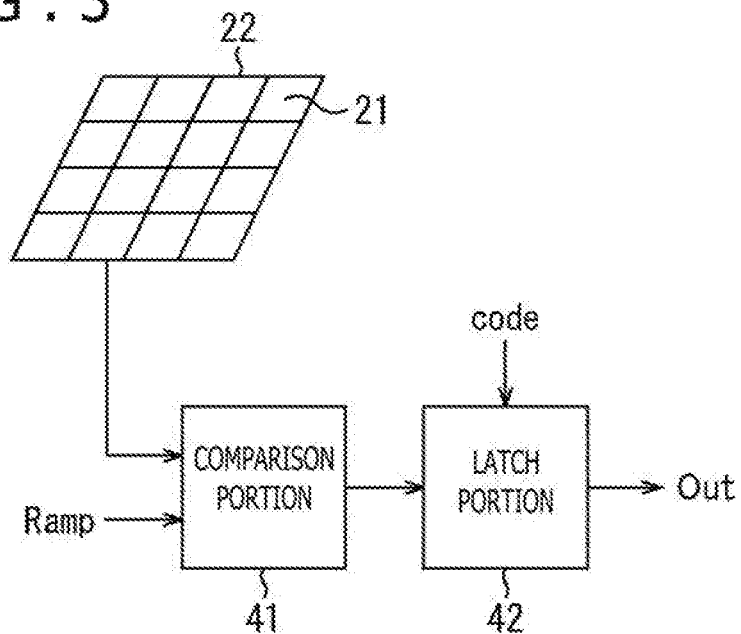
FIG. 3 is a block diagram depicting an example of a configuration of an ADC.

Next, FIG. 3 represents an example of a configuration of the ADC 31 which a plurality of pixels 21 belong to the pixel block 22 shares in common.

The ADC 31 has a comparison portion 41 and a latch portion 42. The comparison portion 41 compares a voltage of the analog pixel signal transferred thereto from each of the pixels 21 in the corresponding pixel block 22 with a reference voltage indicated by the $R_{amp}$ signal inputted thereto from the DAC 34, and outputs the comparison result to the latch portion 42. When the reference voltage indicated by the $R_{amp}$ signal intersects the voltage of the pixel signal on the basis of the comparison result in the comparison portion 41, the latch portion 42 holds therein an inputted code value. The code value held by the latch portion 42 is supplied as the pixel signal after the digital conversion to the digital signal processing portion 32.

Figure 4:
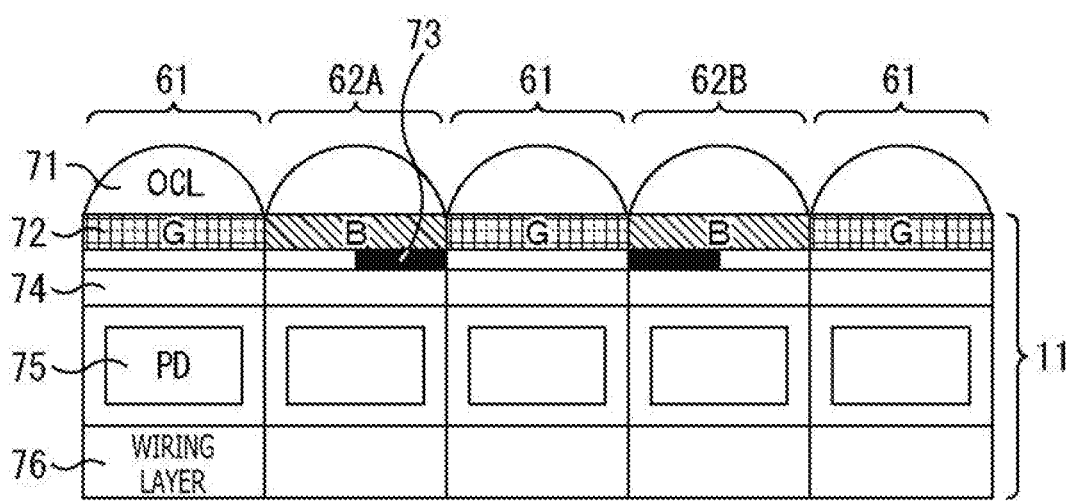
FIG. 4 is a cross-sectional view depicting an example of a configuration of a normal pixel and a pixel for phase difference detection.

Next, FIG. 4 is a cross-sectional view depicting an example of a configuration of the normal pixel and the pixel for phase difference detection which are arranged in the same row. It should be noted that although the example of the configuration depicted in the figure is of a backside irradiation type, a front-side irradiation type may also be adopted.

As a configuration common to the normal pixel 61 and the pixel 62 for phase difference detection, an on-chip lens (OCL) 71, a color filter 72, an insulating layer 73, a photoelectric conversion portion (PD) 75, and a wiring layer 76 are formed in order from an incidence surface side of the light. In paired pixels 62A and 62B for transverse phase difference detection, a light blocking film 73 for limiting an opening is formed between the color filter 72 and the insulating layer 74.

In the normal pixel 61, after the light converged by the on-chip lens 61 is transmitted through the color filter 72, the light is made incident to the photoelectric conversion portion 75 to be photo-electrically converted to produce the electric charges, and the resulting electric charges are outputted to a subsequent stage through the wiring layer 76.

In the pixel 62 for phase difference detection, after the light converged by the on-chip lens 61 is transmitted through the color filter 72, the incident light from the opening which is limited by the light blocking film 73 is photo-electrically converted by the photoelectric conversion portion 75 to produce the electric charges, and the resulting electric charges are outputted to a subsequent stage through the wiring layer 76.

It should be noted that in the case where the light blocking layer 73 is formed by using a metal, the color filter 72 in the pixel 62 for phase difference detection may be omitted. In this case, it is only necessary that the pixel concerned is treated as a defective pixel, and the pixel signal from the defective pixel is outputted by using the pixel signal from the neighborhood normal pixel.

First Embodiment

Figure 5:
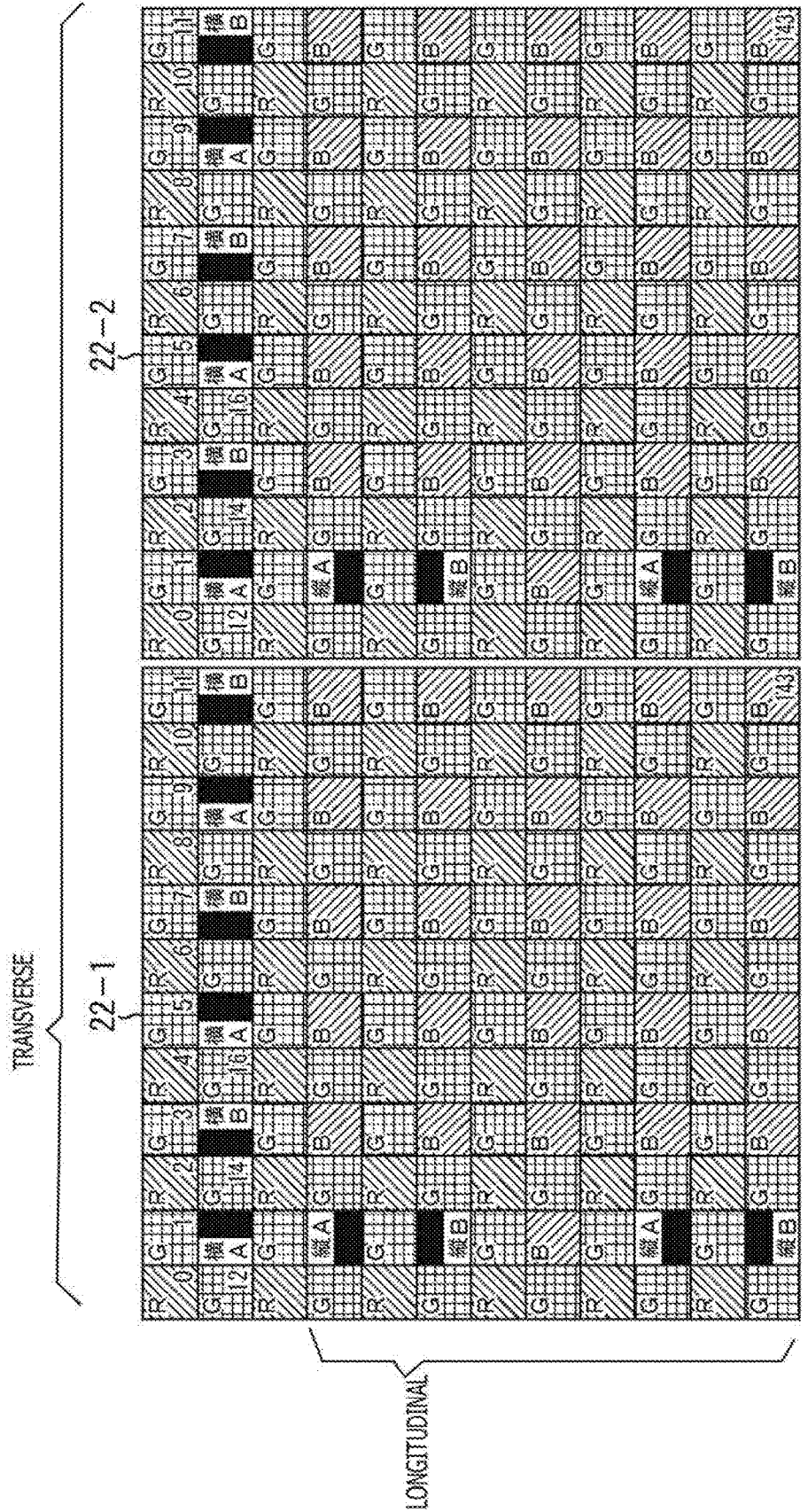
FIG. 5 is a block diagram representing a first embodiment of the present disclosure.

FIG. 5 depicts an example of arrangement (first embodiment) of the pixels for phase difference detection in the pixel blocks 22-1 and 22-2 adjacent to each other.

In the first embodiment, the pixel block 22 includes 12×12 pixels. In addition, R, G, and B represent the normal pixels which are covered with the color filters of red (R), green (G), or blue (B), and produce the pixel signals used in the pixel signals in response to the light made incident through the color filters.

Transverse A and transverse B represent one and the other of the pair of pixels for transverse phase difference detection which produce the pixel signals for phase difference detection in response to the light made incident through the limited opening. Likewise, longitudinal A and longitudinal B represent one and the other of the pair of pixels for longitudinal phase difference detection.

Numeral values of 0 to 143 represent the order of the exposure and the reading for the AD conversion in the pixel block 22 (hereinafter, simply referred to as the order for the AD conversion). This also applies to the subsequent drawings.

The normal pixels R, G and B in the first embodiment are arranged by adopting the Bayer array. The pair of pixels for transverse phase difference detection is arranged in one row of the pixel block 22 instead of the normal pixels B in the Bayer array. B is the normal pixel for producing the pixel signal corresponding to the blue color and the blue color is lower in visibility than each of the red color and the green color. Therefore, not the normal pixels R and G, but the normal pixel B is replaced with the pixel for phase difference detection, thereby enabling the image quality to be held as compared with the case where any of the normal pixels R and G is replaced with the pixel for phase difference detection. In addition, the pair of pixels for longitudinal phase difference detection is arranged in one column of the pixel block 22 instead of the normal pixels B in the Bayer array. It should be noted that although in case of the figure, the pair of pixels for phase difference detection are arranged within the same pixel block 22, the pair of pixels for phase difference detection may be arranged so as to straddle the pixel block 22.

It should be noted that the position where the pixel for phase difference detection such as the pair of pixels for transverse phase difference direction or longitudinal phase difference direction is by no means limited to the position of the normal pixel B indicating the low visibility, but may be arranged in the position of the normal pixel G. The normal pixel G occupies two pixels in the Bayer array with four pixels as one unit. Thus, even when one pixel of the two pixels is replaced with the pixel for phase difference detection, the pixel signal corresponding to the green color can be obtained. In addition, the pixel for phase difference detection may be arranged in the position of the normal pixel R. This will also apply to other embodiments.

Moreover, the pixels for phase difference detection may be discretely arranged instead of the normal pixels corresponding to the specific color in the row or in the column. In addition thereto, the pixels for phase difference detection may be arranged instead of all the normal pixels corresponding to a specific color in the row or in the column, or the pixels for phase difference detection may be arranged at positions of all the pixels in the row or in the column.

The AD conversion for each pixel from the pixels of the pixel block 22 in the first embodiment is carried out in order corresponding to the arrangement of the pixels in the pixel block 22 without distinguishing the normal pixel and the pixel for phase difference detection from each other. For example, the pixel at the left end of the row of the uppermost stage in the pixel block 22 is the 0-th pixel for the AD conversion, and the AD conversion is carried out in order from the 0-th pixel for the AD conversion to the pixel at the right end in the transverse direction. Next, the target pixel is shifted to the row one stage lower than the previous row, and the AD conversion is carried out from the pixel at the left end to the pixel at the right end again. Therefore, the order of the AD conversion of the lower right pixel of the pixel block 22 becomes 143-th. It should be noted that the order of the AD conversion is by no means limited to the example described above. For example, the pixel in the lower left may be set as the 0-th pixel for the AD conversion, and the pixel in the upper right may be set as the 143-th pixel for the AD conversion.

In case of the first embodiment, it is the feature that the arrangement of the pixels for phase difference detection in the pixel blocks 22 is common, and the AD conversion of the pixels is carried out in order corresponding to the arrangement of the pixels in the pixel block 22 without distinguishing the normal pixels and the pixels for phase difference detection from each other. In addition, it is the feature that the order of the AD conversion of the pixels in the pixel blocks 22 is common among all the pixel blocks 22. In a word, the arrangement of the pixels for phase difference detection in the pixel blocks 22 indicates a corresponding relationship among the pixel blocks in the order of the AD conversion as well as the actual arrangement. By having such features, similarly to the case of the past area ADC system, the order of the reading of the pixels can be controlled irrespective of the arrangement of the pixels for phase difference detection. In addition, a column selection signal and a row selection signal in accordance with which the reading from the pixels is controlled can be made common for the pixel blocks. However, some pixel blocks 22 in each of which none of the pixels for phase difference detection is arranged may be included in the pixel blocks 22 configuring the pixel array 20.

Second Embodiment

Figure 6:
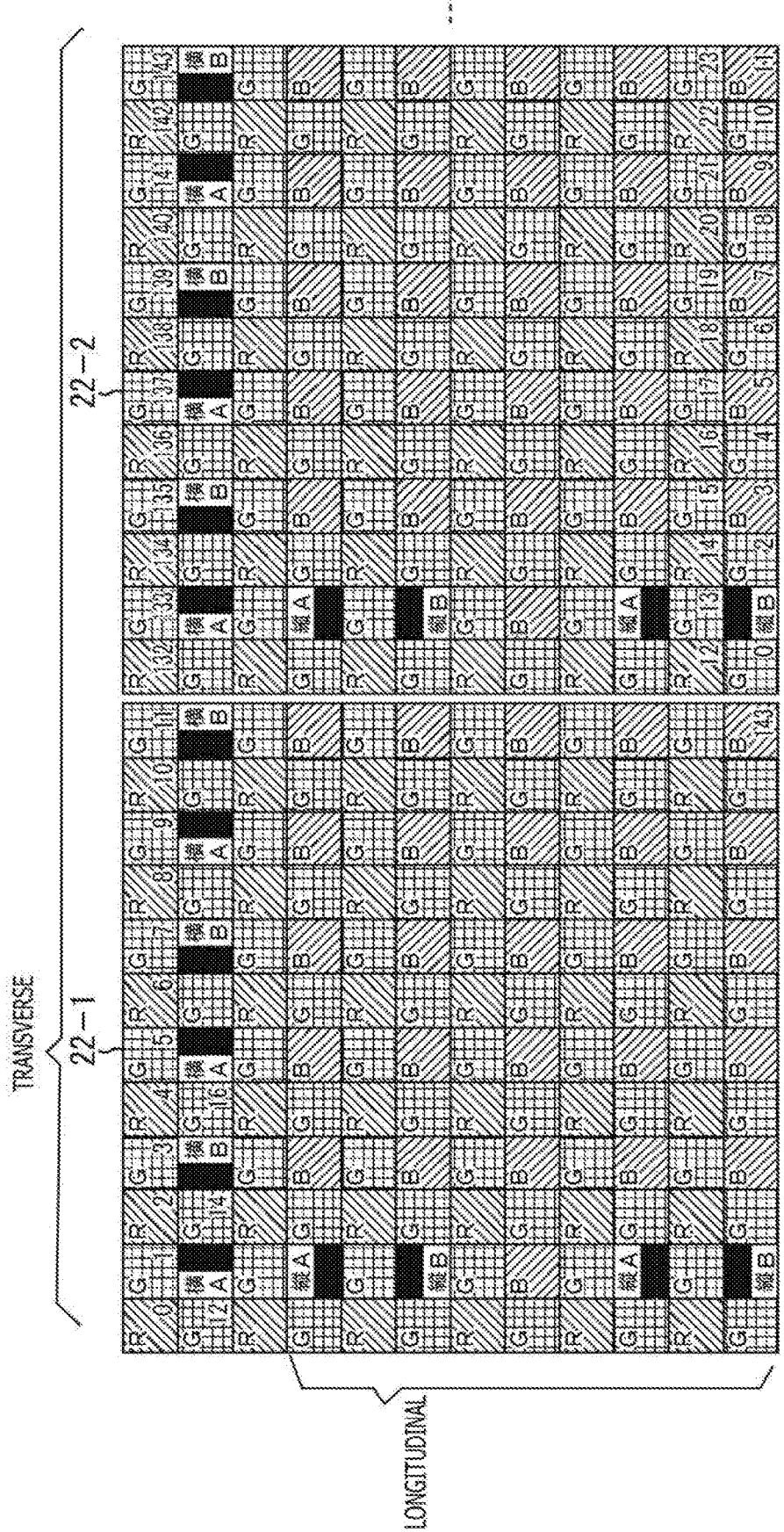
FIG. 6 is a block diagram representing a second embodiment of the present disclosure.

Next, FIG. 6 depicts an example of a second embodiment. In the second embodiment, similarly to the case of the first embodiment described above, the arrangement of the pixels for phase difference detection is common among the pixel blocks 22. However, the order of the AD conversion for the pixels differs among the pixel blocks 22. It should be noted that the pixel blocks 22 in which the order of the AD conversion for the pixels is common may be present in the pixel array 20.

In case of an example depicted in FIG. 6, with respect to the pixel block 22-1, after the reading is started from the upper left pixel in the row direction to reach the right end, the row for the reading is moved in a downward direction, and finally, the reading is carried out for the lower right pixel. On the other hand, with respect to the pixel block 22-2, after the reading is started from the lower left pixel in the row direction to reach the right end, the row for the reading is moved in an upward direction, and finally, the reading is carried out for the upper right pixel.

In the case where like the second embodiment, the arrangement of the pixels for phase difference detection is common among the pixel blocks 22, and the order of the AD conversion for the pixels differs among the pixel blocks 22, for example, if the pixel signals are simultaneously read out from the adjacent pixels each belonging to each of the adjacent pixel blocks 22, then, a problem (the problem, for example, is such that the image is shifted in the boundary between the adjacent pixel blocks 22 in the case where a subject is a moving body, and so forth) due to the shift of the timing between the adjacent pixel blocks can be suppressed. At this time, the pixels for phase difference detection in the pixel blocks 22 indicate the corresponding arrangement among the pixel blocks. Therefore, since the intervals among the pixels for phase difference detection become uniform in the whole area or in a certain area, the accuracy of detection of a focal point can be enhanced, and especially, this is advantageous in such detection of the focal point as to follow the subject which moves so as to straddle the pixel block.

Third Embodiment

Figure 7:
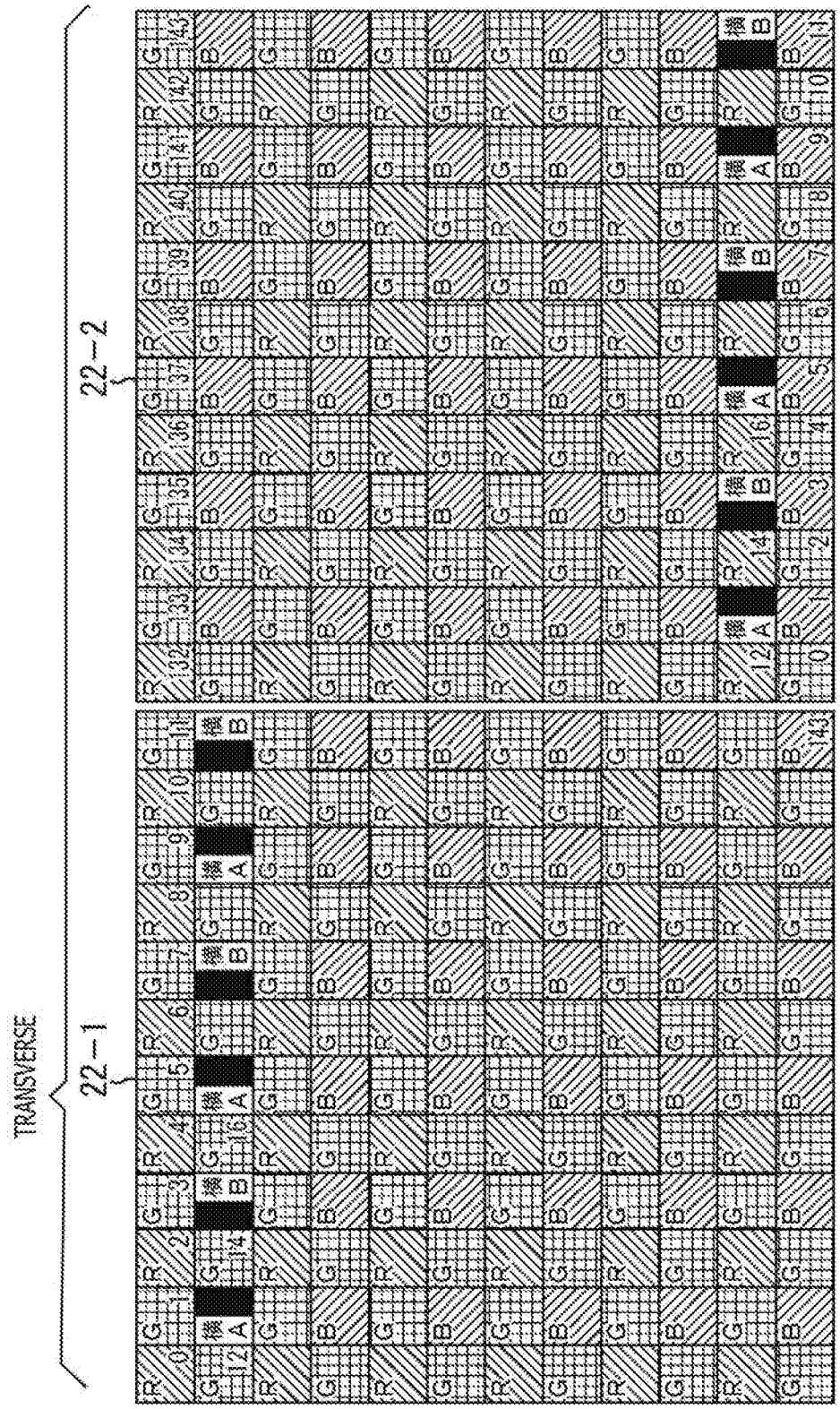
FIG. 7 is a block diagram representing a third embodiment.

Next, FIG. 7 depicts an example of a third embodiment. Although in the third embodiment, the arrangement of the pixels for phase difference detection differs among the pixel blocks 22, and the order of the AD conversion for the pixels differ among the pixel blocks 22, the order of the AD conversion for the pixels for phase difference detection is communalized among the pixel blocks 22.

In case of the example depicted in FIG. 7, in the pixel block 22-1, pairs of pixels for transverse phase difference detection are arranged in the second row from the top, and in the pixel block 22-2, pairs of pixels for transverse phase difference detection are arranged in the second row from the bottom.

Then, with respect to the pixel block 22-1, after the reading is started from the upper left pixel in the row direction to reach the right end, the row for the reading is moved in a downward direction, and finally, the reading is carried out for the lower right pixel. On the other hand, with respect to the pixel block 22-2, after the reading is started from the lower left pixel in the row direction to reach the right end, the row for the reading is moved in an upward direction, and finally, the reading is carried out for the upper right pixel.

That is to say, in the pixel block 22-1 and the pixel block 22-2, the pixel signals are each read out from 13-th, 15-th, 17-th, 19-th, 21-th, and 23-th pixels for phase difference detection, and are then AD-converted.

Like the third embodiment, even when the arrangement of the pixels for phase difference detection differs among the pixel blocks 22, the order of the AD conversion for the pixels for phase difference detection in the pixel block 22 is communalized among the pixel blocks 22. As a result, the arrangement of the pixels for phase difference detection in the pixel block 22 indicates the corresponding relationship among the pixel blocks, and the pixel signals after the AD conversion for the pixels for phase difference detection can be obtained at the same timing from the pixel blocks 22. Therefore, the phase difference detection AF can be speedily carried out.

Modified Change of Third Embodiment

Figure 8:
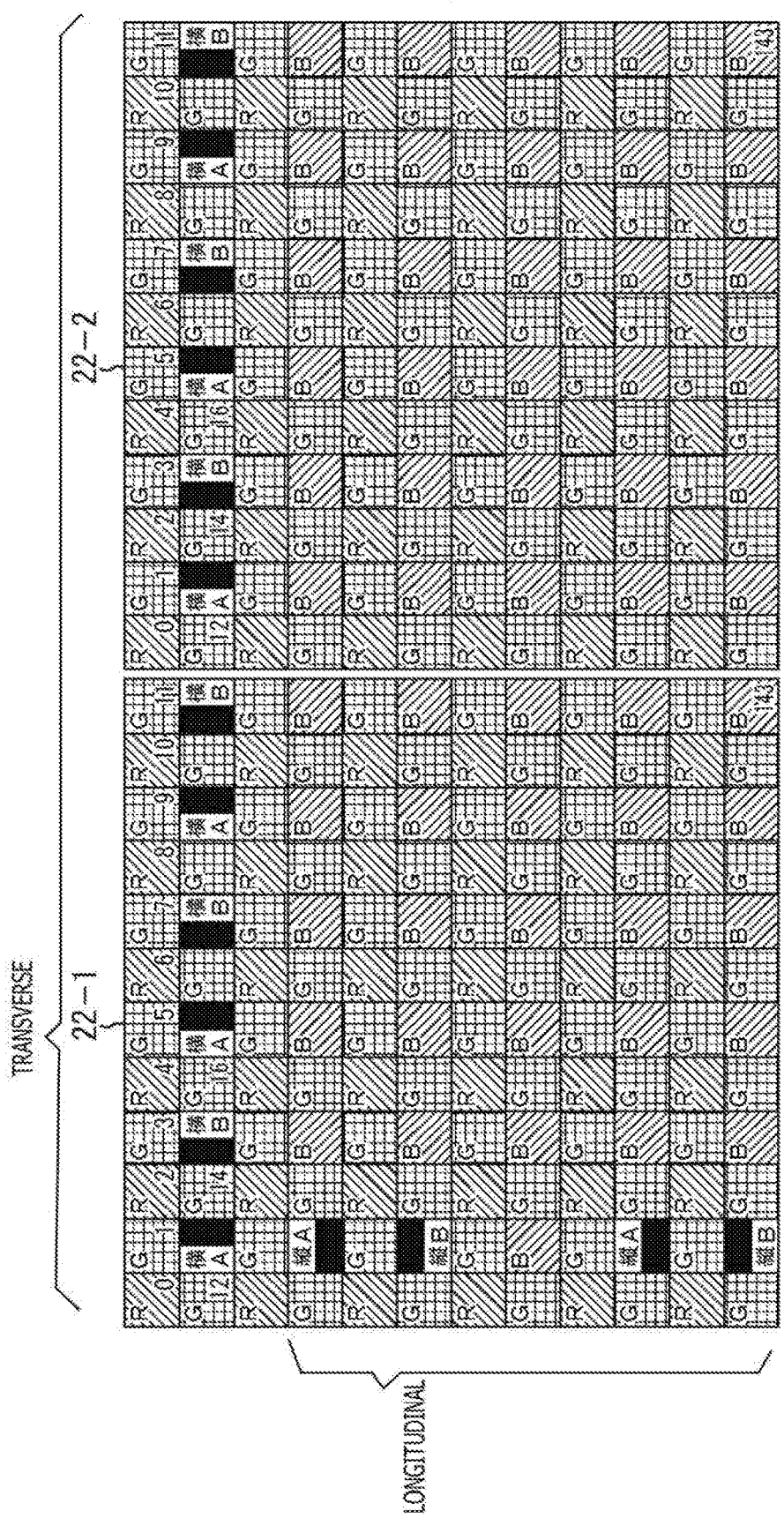
FIG. 8 is a block diagram representing a modified change of the third embodiment.

Next, FIG. 8 depicts a modified change of the third embodiment.

A modified change of FIG. 8 is such that the pairs of pixels for longitudinal phase difference detection are omitted from the pixel block 22-2 in the third embodiment depicted in FIG. 7. That is to say, the modified change concerned depicts an example in the case where the arrangement of the pixels for phase difference detection may not be common among the pixel blocks 22.

The order of the AD conversion for each pixel in the pixel block 22 in the modified change concerned is common among all of the pixel blocks 22 and the AD conversion is carried out in the order responding to the arrangement of the pixels in the pixel block 22 without distinction of the normal pixel and the pixel for phase difference detection. However, for example, when the pixel signal is read out from the pixel for longitudinal phase difference detection in the pixel block 22-1 and is then AD-converted, the pixel signal from the normal pixel B in the same position in the pixel block 22-2 is not used for the phase difference detection to be unnecessary. Therefore, the transfer gate may be turned OFF, or the row selection signal may be set to OFF.

Fourth Embodiment

Figure 9:
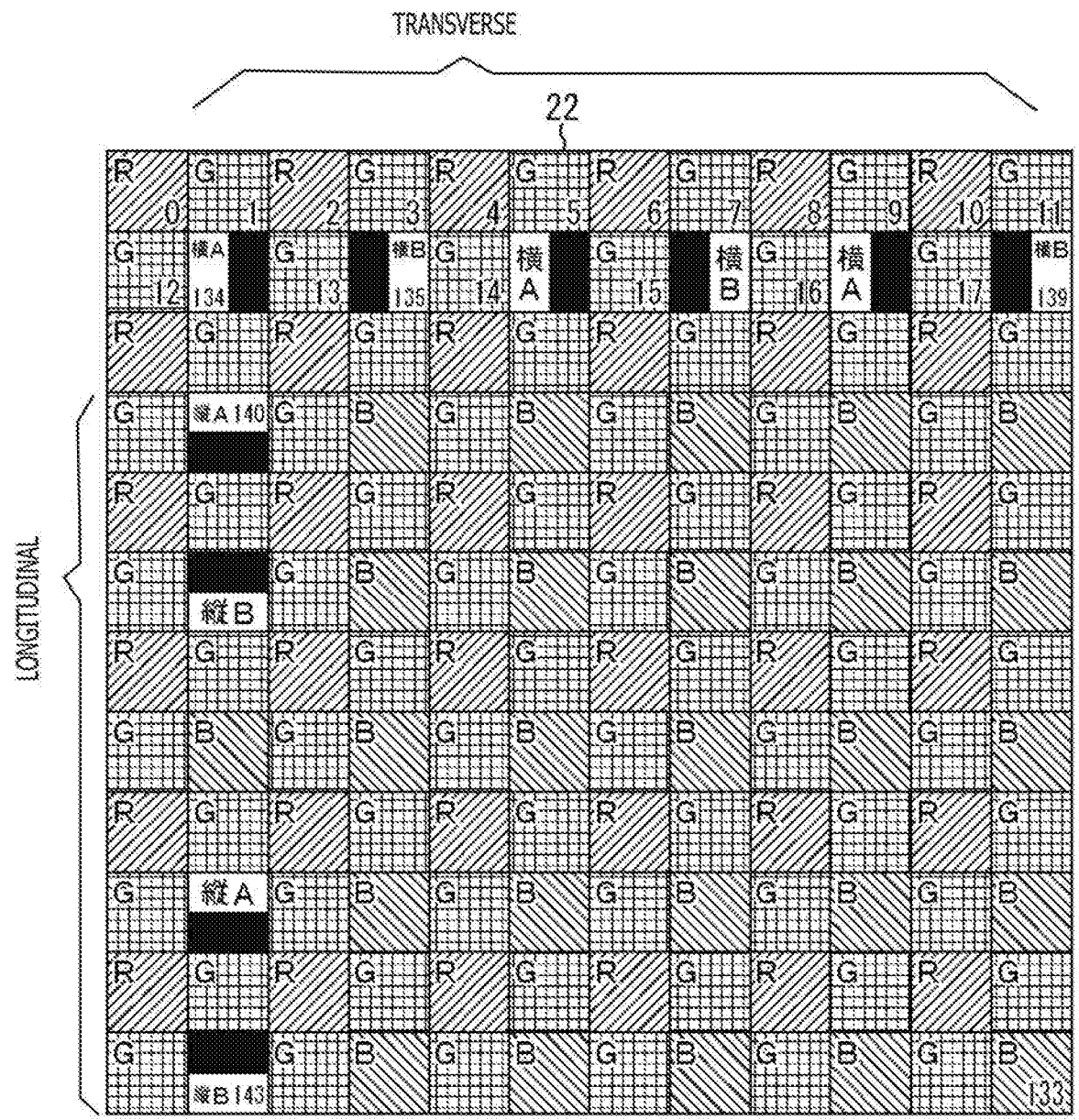
FIG. 9 is a block diagram representing a fourth embodiment of the present disclosure.

Next, FIG. 9 depicts another example (fourth embodiment) of the order of the AD conversion for the pixel from the pixels in the pixel block 22 in the first embodiment.

With respect to the order of the AD conversion for the pixels in the fourth embodiment after the normal pixels and the pixels for phase difference detection are distinguished from each other, and the pixel signals from ones of the normal pixels and the pixels for phase difference detection are continuously AD-converted in accordance with the order responding to the arrangement, the pixel signals from the others are continuously AD-converted in accordance with the order responding to the arrangement.

For example, the pixels for phase difference detection are skipped to early carry out the AD conversion for only the pixel signals from the normal pixels from the upper left to the lower right. In this case, the order of the AD conversion for the pixel signal from the lower right normal pixel in the pixel block 22 is 133-th. Next, the pixels for phase difference detection which are skipped are AD-converted in order.

It should be noted that the normal pixels may be skipped and to early carry out the AD conversion for the pixels for phase difference detection. In this case, since the phase difference detection processing can be carried out on the basis of the pixel signals from the pixels for phase difference detection from which the reading of the pixel signals has been completed during a period of time for the AD conversion for the normal pixel it is expected to enhance the AF speed in the frame next time.

In case of the fourth embodiment, it is the feature that the normal pixels and the pixels for phase difference detection are distinguished from each other, and the AD conversion for the pixels for phase difference detection is continuously carried out. More specifically, there are considered a method in which after the pixel signals from one of the normal pixels and the pixels for phase difference detection are continuously read out, the pixel signals from the others are continuously read out, and a method in which only the pixel signals from one of the normal pixels and the pixels for phase difference detection are read out. In case of the latter method, since exposure time of the normal pixels and the pixels for phase difference detection can be changed, with respect to the normal pixels, the enhancement of the SN ratio can be expected. In addition, in the case where only the pixel signals are read out from the pixels for phase difference detection by using the latter method, as compared with the case where the normal pixels and the pixels for phase difference detection are not distinguished from each other, a difference between the timings of the exposure, the reading for the pixels for phase difference detection becomes small. As a result, since the AF speed can be enhanced, for example, the latter method is suitable for the case where the continuous shooting is carried out. In addition, in the case where only the pixel signals are read out from the normal pixels by using the latter method, as compared with the case where the normal pixels and the pixels for phase difference detection are not distinguished from each other, a through image can be speedily outputted.

It should be noted that as a modified change of the fourth embodiment, the AD conversion for the normal pixels, and the AD conversion for the pixels for phase difference detection may be simultaneously carried out in parallel to each other.

Fifth Embodiment

Figure 10:
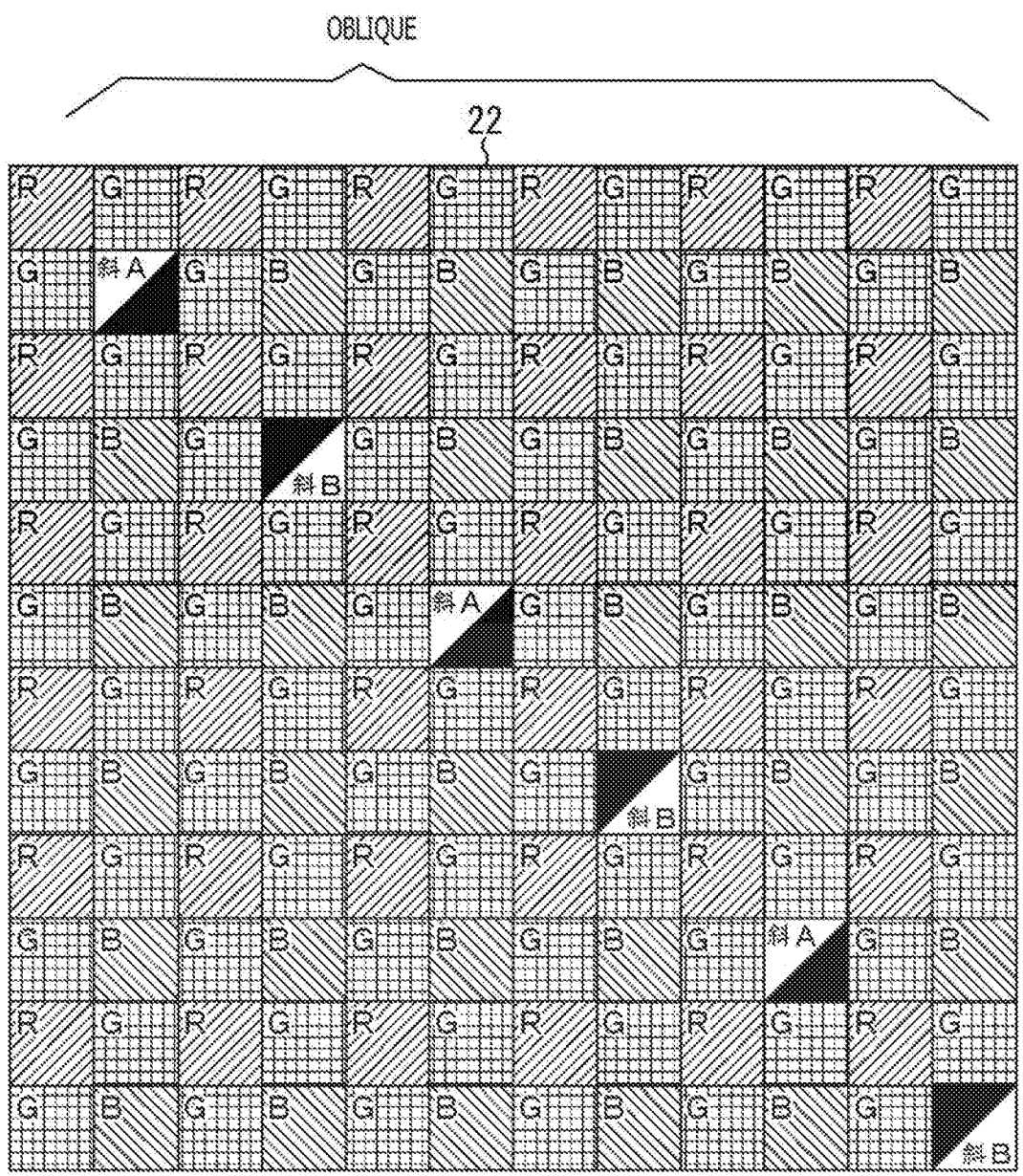
FIG. 10 is a block diagram representing a fifth embodiment of the present disclosure.

FIG. 10 depicts still another example (fifth embodiment) of the arrangement of the pixels for phase difference detection in the pixel block 22.

A fifth embodiment is such that pairs of pixels for oblique phase difference detection are arranged in the pixel block 22. Oblique A and oblique B in the figure form a pair of pixels for oblique phase difference detection, and represent a pixel in which one of an upper left opening and a lower right opening is limited, and a pixel in which the other opening is limited. These paired pixels are arranged in the direction of the lower right angle of 45 degrees instead of the normal pixels B in the Bayer array.

It should be noted that the positions where the pairs of pixels for oblique phase difference detection are arranged are by no means limited to the positions of the normal pixels B in the Bayer array, and the pairs of pixels for oblique phase difference detection may be arranged in the positions of the normal pixels R or G.

By arranging the pair of pixels for oblique phase difference detection in the pixel block 22, an influence of a vignetting of a lens arranged in a preceding stage of the solid-state image pickup element can be reduced. In addition thereto, the AF accuracy in the case where the shape or pattern of the subject on the screen extends in an oblique direction (in this case, in a direction of lower right angle of 45 degrees) can be enhanced.

Figure 11:
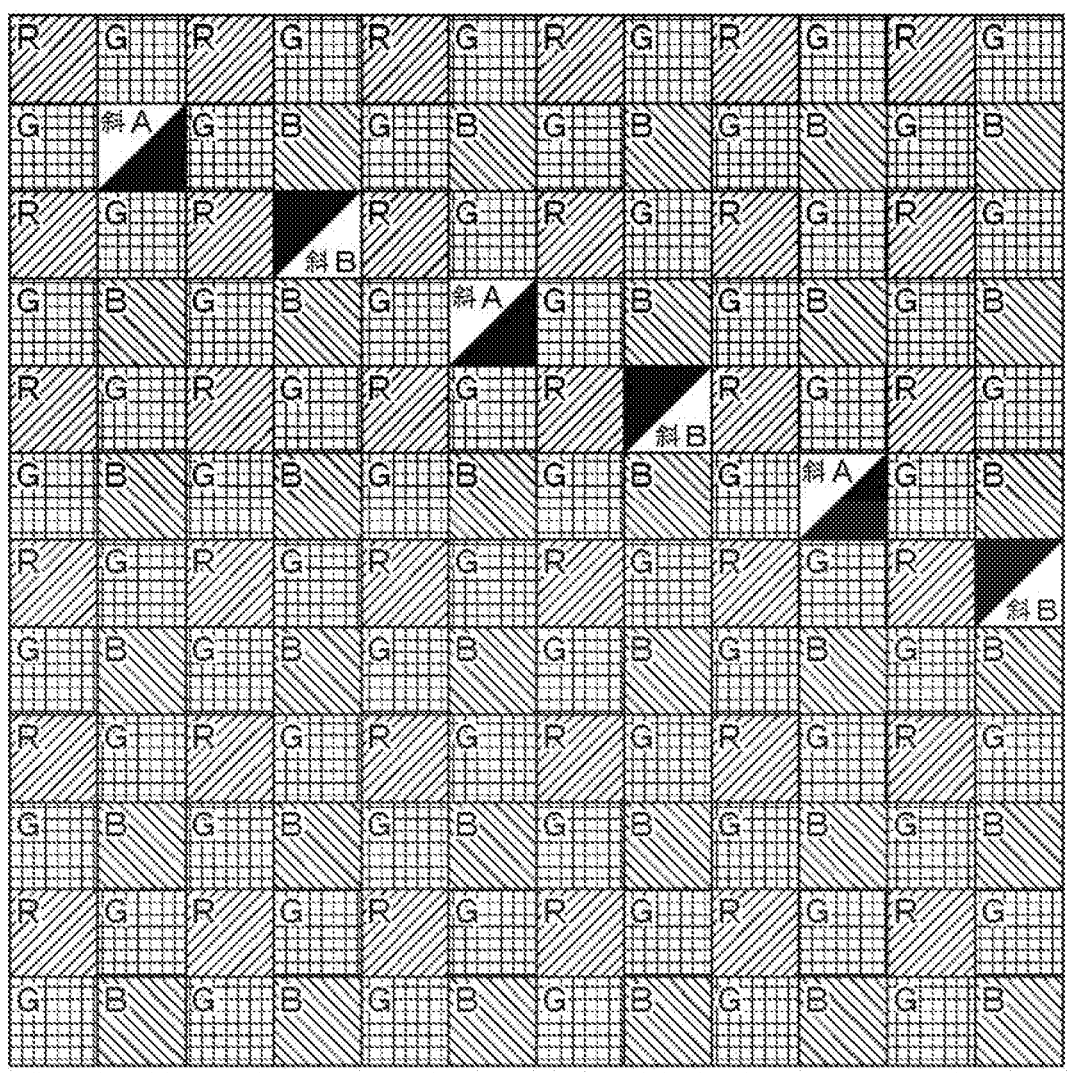
FIG. 11 is a block diagram representing a modified change of the fifth embodiment of the present disclosure.

FIG. 11 depicts a modified change of the fifth embodiment. This modified change is such that the pairs of pixels for oblique phase difference detection which are arranged in the direction of the lower right angle of 45 degrees in the fifth embodiment are arranged in the lower right oblique direction at a shallower angle.

In addition, although an illustration is omitted here, the pairs of pixels for oblique phase difference deflection in each of which the upper right opening or lower left opening of the pixels is limited may be arranged in the upper right oblique direction.

The AD conversion for the pixels in the pixel block 22 in the fifth embodiment and the modified change thereof may be carried out in order without distinguishing the normal pixels and the pixels for phase difference detection from each other, or the AD conversion for the pixels for phase difference detection may be continuously carried out in order so as to distinguish the normal pixels and the pixels for phase difference detection from each other.

In case of the fifth embodiment and the modified change thereof, the pairs of pixels for oblique phase difference detection are arranged in the pixel block 22, thereby enabling the phase difference in the lower right oblique direction to be properly detected.

It should be noted that the pairs of pixels for oblique phase difference detection depicted in the fifth embodiment or the modified change thereof may be suitably combined with the pairs of pixels for transverse phase difference detection or the pairs of pixels for longitudinal phase difference detection depicted in the first embodiment described above to be mixed with each other in the pixel block 22.

For example, the pairs of pixels for oblique phase difference detection and the pairs of pixels for transverse phase difference detection may be mixed with each other in the pixel block 22, the pairs of pixels for longitudinal phase difference detection and the pairs of pixels for oblique phase difference detection may be mixed with each other in the pixel block 22, or the pairs of pixels for oblique phase difference detection, the pairs of pixels for transverse phase difference detection, and the pairs of pixels for longitudinal phase difference detection may be mixed with one another in the pixel block 22.

Sixth Embodiment

Figure 12:
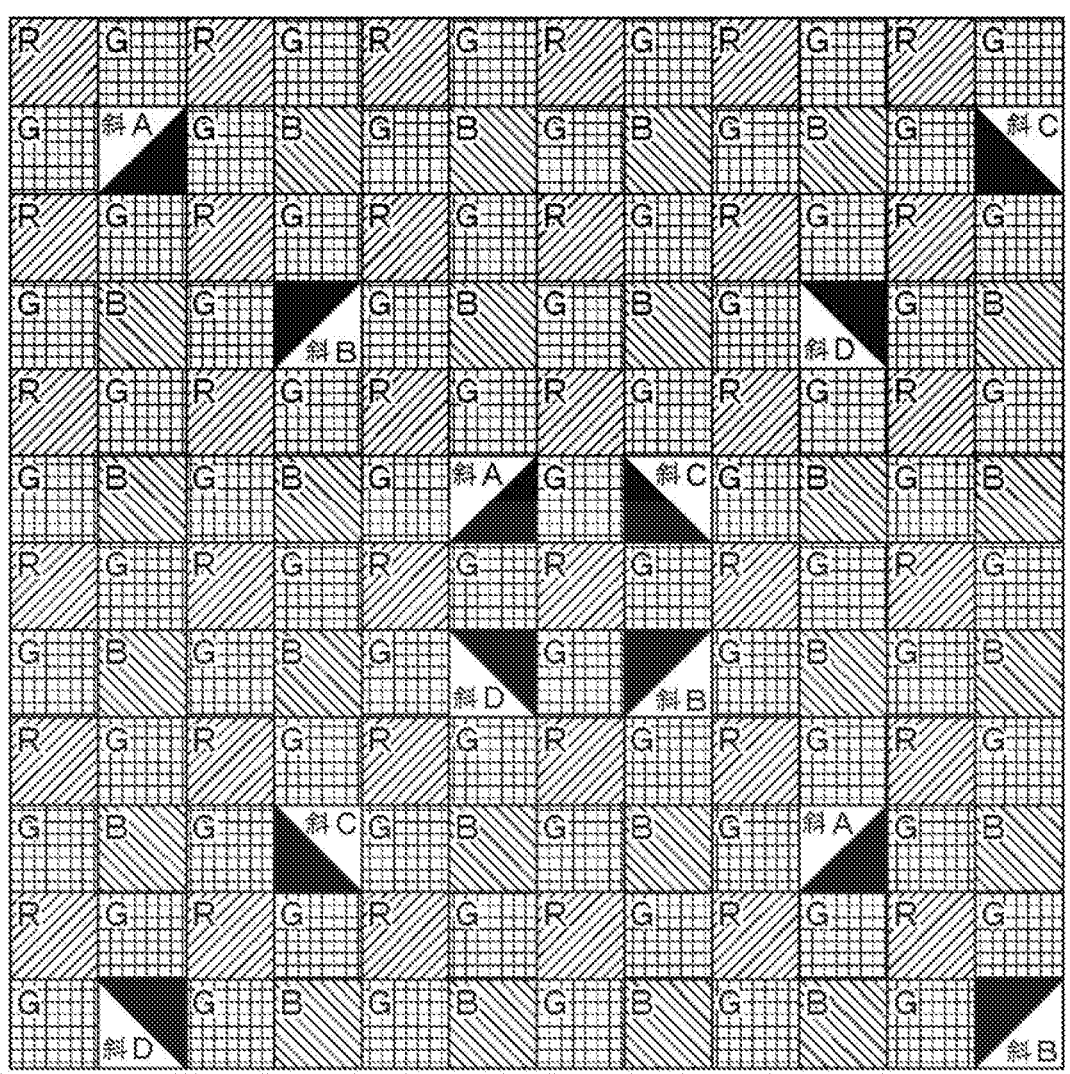
FIG. 12 is a block diagram representing a sixth embodiment of the present disclosure.

FIG. 12 depicts yet another example (sixth embodiment) of arrangement of the pixels for phase difference detection in the pixel block 22.

A sixth embodiment is such that two kinds of pairs of pixels for oblique phase difference detection are arranged n the pixel block 22. Oblique A and oblique B represent a pixel in which one of the upper left opening or the lower right opening is limited, and a pixel in which the other opening is limited, respectively. In addition, oblique C and oblique D represent the pixel in which one of the lower left opening or the upper right opening is limited, and the pixel in which the other opening is limited, respectively.

The two kinds of pixels for oblique phase difference detection are arranged in the lower right oblique direction of 45 degrees and in the upper right oblique direction of 45 degrees perpendicular thereto instead of the normal pixels B in the Bayer array. It should be noted that the positions where the pairs of oblique phase difference detection are arranged are by no means limited to the positions of the normal pixels B in the Bayer array, but may be arranged in the positions of the normal pixels R or G.

The AD conversion for the pixels in the pixel block 22 in the sixth embodiment may be carried out in the order without distinguishing the normal pixels and the pixels for phase difference detection from each other, or the AD conversion for the pixels for phase difference detection may be continuously carried out in the order so as to distinguish the normal pixels and the pixels for phase difference detection from each other.

In case of the sixth embodiment, the two kinds of pairs of pixels for oblique phase difference detection are arranged in the pixel block 22, and as a result, the phase differences in the lower right oblique direction and in the upper right oblique direction can be properly detected.

The pixel blocks 22, in which the pixels for phase difference detection are arranged, represented as the first to sixth embodiments can be suitably combined with one another to configure the pixel array 20.

Figure 13:
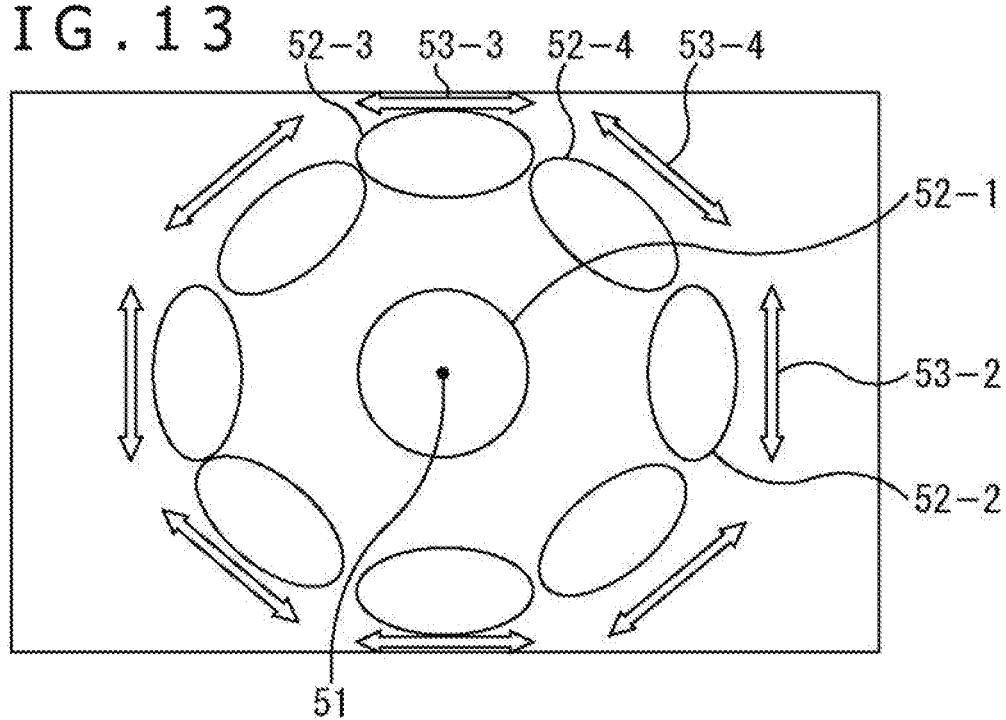
FIG. 13 is a view depicting a pupil shape on an image captured by a solid-state image pickup element.

FIG. 13 depicts a pupil shape, in which the vignetting due to a condenser lens (not depicted) is generated, on the image captured by the solid-state image pickup element 10.

For example, although a pupil shape 52-1 located in an optical axis 51, in which no distortion is generated, becomes a perfect circle, when the pupil shape is shifted from the optical axis center 51, the distortion is generated in the pupil shape.

For example, the distortion is transversely generated in a pupil shape 52-2 which is shifted from the optical axis 51 in a transverse direction. Therefore, if the pixel block 22 is adopted in which the pairs of pixels for longitudinal phase difference detection obtained through the pupil division are arranged in a direction indicated by an arrow 53-2 in the position, then, the sensitivity can be increased and the influence of the vignetting can be reduced.

In addition, for example, the distortion is longitudinally generated in a pupil shape 52-3 which is shifted in the longitudinal direction from the optical axis 51. Therefore, if the pixel block 22 is adopted in which the pairs of pixels for transverse phase difference detection obtained through the pupil division are arranged in a direction indicated by an arrow 53-3 in the position, then, the sensitivity can be increased and the influence of the vignetting can be reduced.

Moreover, for example, the distortion is obliquely generated in a pupil shape 52-4 which is shifted in the oblique direction from the optical axis 51. Therefore, if the pixel block 22 is adopted in which the pairs of pixels for oblique phase difference detection obtained through the pupil division are arranged in a direction indicated by an arrow 53-4 in the position, then, the sensitivity can be increased and the influence of the vignetting can be reduced.

Various Kinds of Modified Changes

Figure 14:
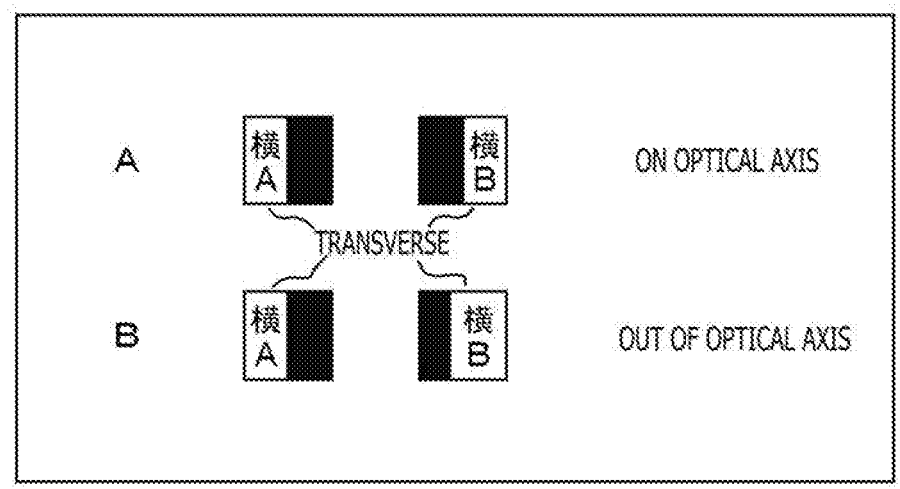
FIG. 14 is a view depicting an example of a pair of pixels for transverse phase difference detection which are different in an opening area from each other.

FIG. 14 depicts an example of pairs of pixels for transverse phase difference detection in which opening areas are different from each other.

With respect to the pairs of pixels for transverse phase difference detection, for example, as depicted in A of FIG. 14, opening areas of both the pixels may be identical to each other, or as depicted in B of FIG. 14, the pair of pixels for transverse phase difference detection may be formed in such a way that opening areas of both the pixels may be different from each other. It should be noted that a difference between the opening areas of both the pixels may be changed in response to a focal length of the condenser lens.

The pair of pixels for transverse phase difference detection depicted in A of the figure, for example, is desirably arranged in the pixel block 22 on the optical axis. The pair of pixels for transverse phase difference detection depicted in B of the figure, for example, is desirably arranged in the pixel block 22 which is shifted from the optical axis.

In addition, the pair of pixels for transverse phase difference detection in which the opening areas of both the pixels are identical to each other as depicted in A of the figure, and the pair of pixels for transverse phase difference detection in which the opening areas of both the pixels are different from each other as depicted in B of the figure may be mixed with each other in the same pixel block 22.

It should be noted that although FIG. 14 depicts only the pairs of pixels for transverse phase difference detection, this also applies to the pairs of pixels for longitudinal phase difference detection, and the pairs of pixels for oblique phase difference detection.

Although in the above description, the pixels for phase difference detection are arranged separately from the normal pixels, the pixels for phase difference detection serving as the normal pixels as well may be arranged. In this case, all the pixels may be made the pixels for phase difference detection serving as the normal pixels as well, or a part of the pixels may be made the pixels for phase difference detection serving as the normal pixels as well.

Figure 15:
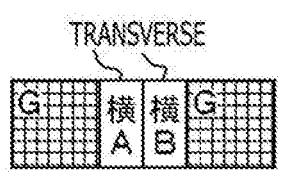
FIG. 15 is a view depicting an example of a pair of pixels for phase difference detection each of which has the same area as that of a normal pixel.

Although in the above description, the pixel for phase difference detection is made to have the same size as that of the normal pixel, as depicted in FIG. 15, a pair of pixels for phase difference detection may be arranged in an area for one pixel of the normal pixel.

Figure 16:
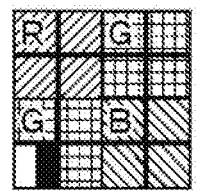
FIG. 16 is a view depicting the case where the normal pixel is divided into four parts which are in turn used in the pixels for phase difference detection.

Therefore, as depicted in FIG. 16, each of the normal pixels R, G and B may be divided into four parts, and ¼ of the area of the normal pixel (in case of the figure, the normal pixel G) of any of them may be set as the area for the pixel for phase difference detection.

Figure 17:
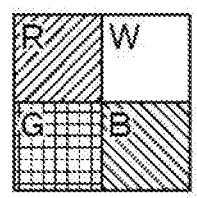
FIG. 17 is a view depicting an example of a unit of arrangement of normal pixels including R, G, B, and W.

Although in the above description, the arrangement of the normal pixels R, G and B adopts the Bayer array, as depicted in FIG. 17, there may be adopted an arrangement unit in which a normal pixel W corresponding to a white color (W) is added to the normal pixels R, G and B. In this case, the pixel for phase difference detection may be arranged in the position of the normal pixel W instead by prioritizing the outputs from the normal pixels R, G and B, or may be arranged in any of the positions of the normal pixels R, G and B instead by prioritizing the output from the normal pixel W.

Figure 18:
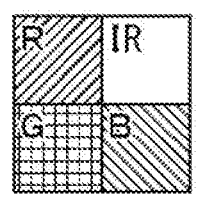
FIG. 18 is a view depicting an example of a unit of arrangement of normal pixels including R, G, B, and IR.

Therefore, as depicted in FIG. 18, there may be adopted an arrangement unit in which a normal pixel IR having a sensitivity to irradiated radiation (IR) is added to the normal pixels R, G and B. In this case, the pixel for phase difference detection may be arranged in the position of the normal pixel IR instead by prioritizing the outputs from the normal pixels R, G and B, or may be arranged in the position of any of the normal pixels R, G and B by prioritizing the output from the normal pixel IR.

Figure 19:
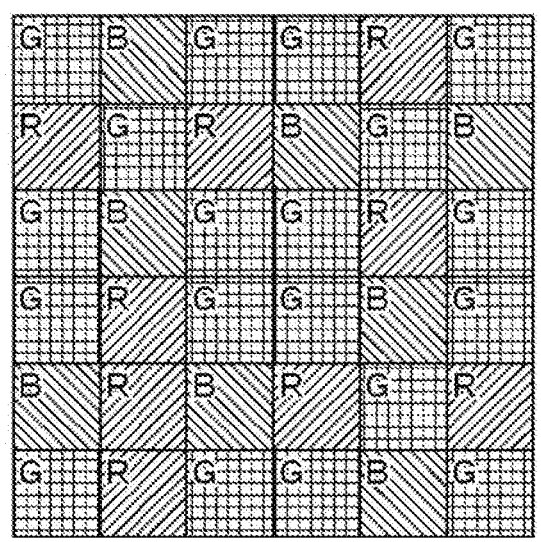
FIG. 19 is a view depicting an example of a unit of arrangement of normal pixels including R, G, and B.

Furthermore, an arrangement unit of 6×6 pixels indicating low periodicity as depicted in FIG. 19 may be adopted in the arrangement of the normal pixels R, G and B. In this case, the pixel for phase difference detection may be alternatively arranged in any of the normal pixels R, G and B. In the case where the arrangement unit depicted in the figure is adopted, since the periodicity of the colors is low, the Moire can be reduced. In addition, since the normal pixels R, G and B are necessarily present in the longitudinal direction and in the transverse direction, the accurate color reproduction in which even a false color is suppressed becomes possible.

<Modified Change of Arrangement of Pair of Pixels for Phase Difference Detection>

In the above description, the pixels for phase difference detection are linearly paired in the transverse direction, in the longitudinal direction, or in the oblique direction. With respect to the arrangement of the pairs of pixels for phase difference detection, the pairs of pixels for phase difference detection may be discretely arranged within the pixel block 22. All the pixels corresponding to the specific color in the predetermined row or column may be replaced with the pairs of pixels for phase difference detection, or all the pixels in the predetermined row or column may be replaced with the pairs of pixels for phase difference detection.

<Use Example of Solid-State Image Pickup Element to which the Present Disclosure is Applied>

Figure 20:
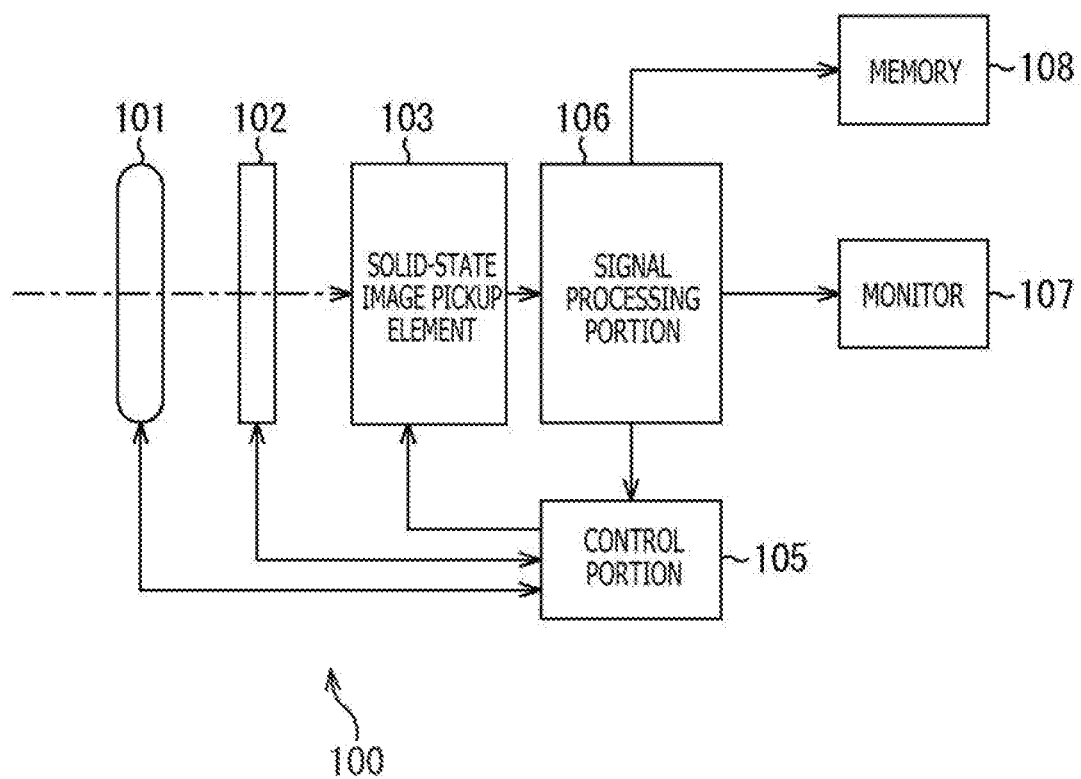
FIG. 20 is a block diagram depicting an example of a configuration of an image pickup apparatus equipped with the solid-state image pickup element to which the present disclosure is applied.

FIG. 20 depicts an example of a configuration of an image pickup apparatus equipped with a solid-state image pickup element to which the present disclosure is applied, that is, an image pickup apparatus as an electronic apparatus to which the present disclosure is applied.

This image pickup apparatus 100 has an optical system 101, a shutter portion 102, a solid-state image pickup element 103, a control portion 105, a signal processing portion 106, a monitor 107, and a memory 108, and can capture a still image and a moving image.

The optical system 101 includes one sheet of or a plurality of sheets of lenses, and guides light (incident light) from a subject to the solid-state image pickup element 103 to image the incident light on a light receiving surface of the solid-state image pickup element 103.

The shutter portion 102 is arranged between the optical system 101 and the solid-state image pickup element 103, and controls a period of time for light irradiation and a period of time for light blocking of the solid-state image pickup element 103 in accordance with the control made by the control portion 105.

The solid-state image pickup element 103 to which the present disclosure is applied accumulates signal electric charges for a given period of time in response to the light which is imaged on the light receiving surface through the optical system 101 and the shutter portion 102. The signal electric charges accumulated in the solid-state image pickup element 103 are transferred in accordance with a drive signal (timing signal) supplied from the control portion 105. The solid-state image pickup element 103 may be configured alone in the form of one chip, or may be configured as a part of a camera module which is packaged together with the optical system 101 to the signal processing portion 106 and the like.

The control portion 105 outputs the drive signal in accordance with which the transfer operation of the solid-state image pickup element 103, and a shutter operation of the shutter portion 102 are controlled, thereby driving the solid-state image pickup element 103 and the shutter portion 102. Moreover, the control portion 105 adjusts the focus of the optical system 101 on the basis of a distance, to the subject, which is notified from the signal processing portion 106.

The signal processing portion 106 executes various kinds of signal processing for the pixel signals, for the normal pixels, which are outputted from the solid-state image pickup element 103. An image (image data) obtained through the signal processing executed by the signal processing portion 106 is supplied to the monitor 107 to be displayed thereon, or supplied to the memory 108 to be stored (recorded) therein. In addition, the signal processing portion 106 executes predetermined signal processing for the pixel signal, from the pixels for phase difference detection, which are outputted from the solid-state image pickup element 103 and calculates a distance to the subject, thereby notifying the control portion 105 of the calculation result.

The image pickup apparatus 100 equipped with the solid-state image pickup element 103 to which the present disclosure is applied can carry out the speedy AF control.

Figure 21:
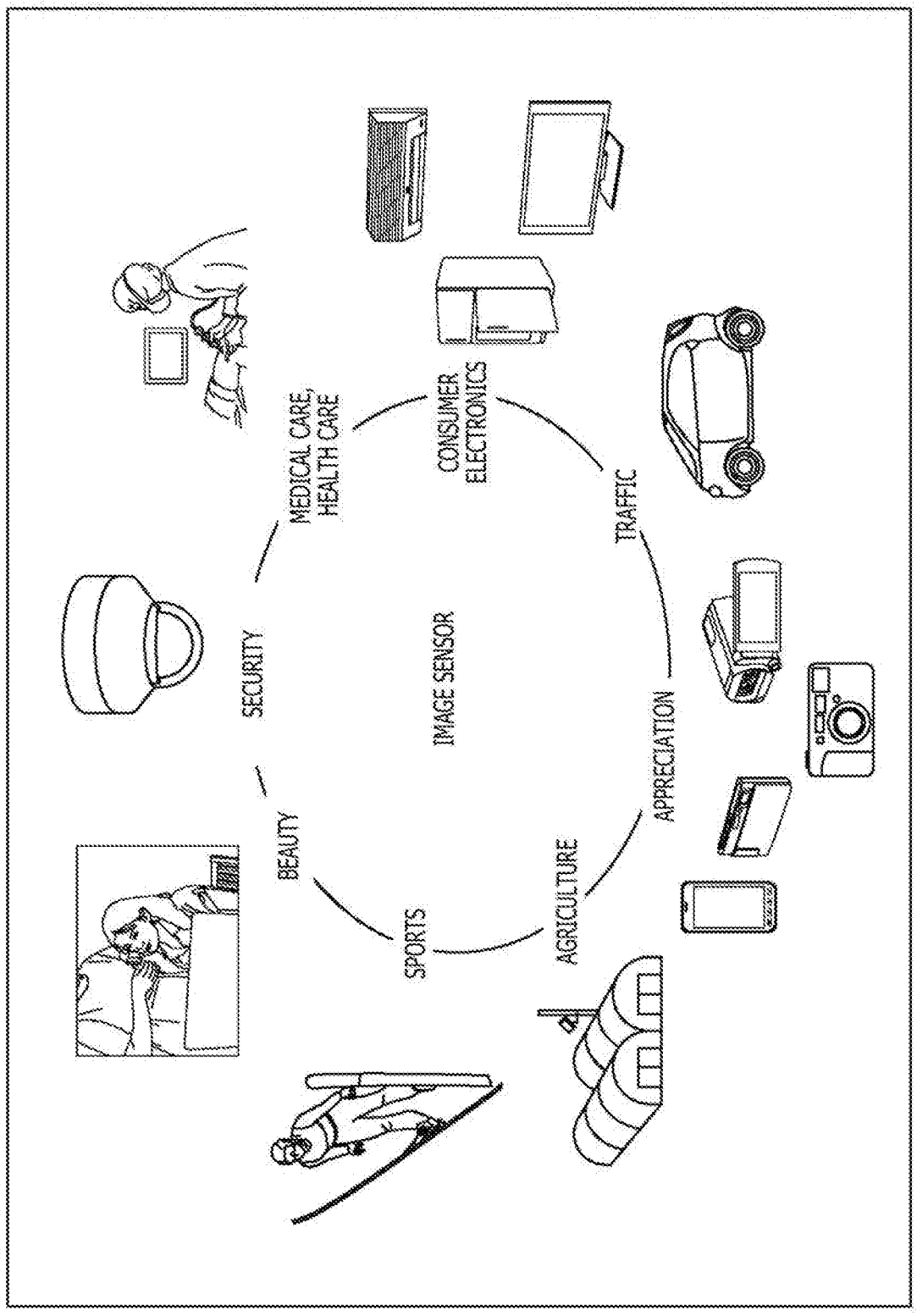
FIG. 21 is a view depicting examples of use of the solid-state image pickup element to which the present disclosure is applied.

Next, FIG. 21 is a view depicting other use examples of the solid-state image pickup element to which the present disclosure is applied.

The solid-state image pickup element described above, for example, as will be described below, can be used in such various cases as to sense the light such as visible light, infrared radiation, ultraviolet rays, and X-rays.

An apparatus, for photographing an image for use in appreciation, such as a digital camera or a portable apparatus with a camera function An apparatus, for use in traffic, such as an on-board sensor for photographing, a front side, a rear side, a periphery, a car interior for safe driving such as automatic stop, recognition or the like of a state of a driver, or the like a monitoring camera for monitoring a road for a travelling vehicle, or a distance measuring sensor for measuring a distance between vehicles An apparatus, for use in a consumer electronics, such as a TV, a refrigerator or an air conditioner, for imaging a gesture of a user to carry out an apparatus operation responding to the gesture An apparatus, for use in medical care or health care, such as an endoscope, or an apparatus for photographing a blood vessel by receiving infrared rays An apparatus, for use in security, such as a monitoring camera for security applications, or a camera for person authentication applications An apparatus, for use in beauty, such as a skin measuring instrument for photographing a skin, or a microscope for photographing a scalp An apparatus, for sport, such as an action camera or a wearable camera for sport applications An apparatus, for use in agriculture, such as a camera for monitoring a state of a field or crops It should be noted that the embodiments of the present disclosure are by no means limited to the embodiments described above, and various changes can be made without departing from the subject matter of the present disclosure.

The present disclosure can also adopt the following constitutions.

(1)

An solid-state image pickup element, including:

a pixel array partitioned into a plurality of pixel blocks each including a normal pixel and a pixel for phase difference detection; and a plurality of AD conversion portions that correspond to the respective plurality of pixel blocks and AD-convert pixel signals based on a plurality of pixels included in the corresponding pixel block, in which the pixel for phase difference detection included in one pixel block of the plurality of pixel blocks, and the pixel for phase difference detection included in the other pixel block of the plurality of pixel blocks are arranged in positions corresponding to each other.

(2)

The solid-state image pickup element according to (1) described above, further including:

a reading control portion configured to control processing for reading out the pixel signals from the plurality of pixels included in the pixel block, and supplying the pixel signals to the corresponding AD conversion portions.

(3)

The solid-state image pickup element according to (2) described above, in which the reading control portion controls the reading of the pixel signals in order responding to arrangement in the pixel block without distinguishing the normal pixel and the pixel for phase difference detection from each other.

(4)

The solid-state image pickup element according to (2) described above, in which the reading control portion controls, after the normal pixel and the pixel for phase difference detection are distinguished from each other, and the reading of the pixel signals is controlled in order responding to the arrangement in the pixel block for one of the normal pixel or the pixel for phase difference detection, the reading of the pixel signals in order corresponding to the arrangement in the pixel block for one of the normal pixel or the pixel for phase difference detection.

(5)

The solid-state image pickup element according to any one of (2) to (4) described above, in which the reading control portion reads a plurality of pixels included in the one pixel block in order corresponding to a plurality of pixels included in the other pixel block.

(6)

The solid-state image pickup element according to any one of (1) to (5) described above, in which the pixel for phase difference detection included in one pixel block of the plurality of pixel blocks, and the pixel for phase difference detection included in the other pixel block of the plurality of pixel blocks are arranged in positions common between the respective pixel blocks.

(7)

The solid-state image pickup element according to (5) described above, in which order in accordance with which the pixel signals based on the plurality of pixels in the pixel block are AD-converted is common among the respective pixel blocks.

(8)

The solid-state image pickup element according to (5) described above, in which order in accordance with which the pixel signals based on the plurality of pixels in the pixel block are AD-converted differs depending on the pixel blocks.

(9)

The solid-state image pickup element according to (5) described above, in which the pixel for phase difference detection partitioned in one pixel block of the plurality of pixel blocks, and the pixel for phase difference detection partitioned in the other pixel block of the plurality of pixel blocks are arranged in different positions in the respective pixel blocks, and order in accordance with which the pixel signals based on the pixels for phase difference detection in the respective pixel blocks are AD-converted is common among the respective pixel blocks.

(10)

The solid-state image pickup element according to any one of (1) to (9) described above, in which the pixel array is formed in a first substrate, and the plurality of AD conversion portions are formed in a second substrate the first substrate and which are laminated on each other.

(11)

The solid-state image pickup element according to any one of (1) to (10) described above, in which the pixel for phase difference detection produces a pixel signal used to control phase difference detection auto focus.

(12)

The solid-state image pickup element according to any one of (1) to (11) described above, in which the pixels for phase difference detection in the pixel block are arranged in a transverse direction.

(13)

The solid-state image pickup element according to any one of (1) to (12) described above, in which the pixels for phase difference detection in the pixel block are arranged in a longitudinal direction.

(14)

The solid-state image pickup element according to any one of (1) to (13) described above, in which the pixels for phase difference detection in the pixel block are arranged in an oblique direction.

(15)

The solid-state image pickup element according to any one of (1) to (14) described above, in which the pixel for phase difference detection serves as the normal pixel as well.

(16)

An electronic apparatus equipped with a solid-state image pickup element,
the solid-state image pickup element including:
a pixel array partitioned into a plurality of pixel blocks each including a normal pixel and a pixel for phase difference detection; and
a plurality of AD conversion portions that correspond to the respective plurality of pixel blocks and AD-convert pixel signals based on a plurality of pixels included in the corresponding pixel block,
in which the pixel for phase difference detection included in one pixel block of the plurality of pixel blocks, and the pixel for phase difference detection included in the other pixel block of the plurality of pixel blocks are arranged in positions corresponding to each other.

REFERENCE SIGNS LIST

10 . . . Solid-state image pickup element, 11 . . . Upper substrate, 12 . . . Lower substrate, 20 . . . Pixel array, 21 . . . Pixel, 22 . . . Pixel block, 23 . . . Vertical scanning portion, 24 . . . Horizontal scanning portion, 31 . . . ADC, 32 . . . Digital signal processing portion, 33 . . . Timing producing portion, 34 . . . DAC, 41 . . . Comparison portion, 42 . . . Latch circuit, 61 . . . Normal pixel, 62 . . . Pixel for phase difference detection, 100 . . . Image pickup apparatus

The invention claimed is:

1. A solid-state image pickup element, comprising:
a pixel array that comprises a plurality of pixel blocks, wherein
each of the plurality of pixel blocks comprises a plurality of pixels, and
the plurality of pixels includes a normal pixel and a pixel for phase difference detection;
a plurality of Analog-Digital (AD) converters,
wherein each of the plurality of AD converters corresponds to a respective pixel block of the plurality of pixel blocks; and
circuitry configured to:
read out pixel signals of the plurality of pixels of each pixel block of the plurality of pixel blocks; and
supply the pixel signals of the plurality of pixels of each pixel block of the plurality of pixel blocks to a corresponding AD converter of the plurality of AD converters, wherein
each of the plurality of AD converters is configured to AD-convert the pixel signals of the plurality of pixels of the respective pixel block,
the pixel for phase difference detection of a first pixel block of the plurality of pixel blocks and the pixel for phase difference detection of a second pixel block of the plurality of pixel blocks are arranged in different positions in the first pixel block and the second pixel block, respectively, and
an order of AD conversion of a pixel signal of the pixel for phase difference detection of each of the first pixel block and the second pixel block is common among the first pixel block and the second pixel block.

2. The solid-state image pickup element according to claim 1, wherein the circuitry is further configured to read out the pixel signals in an order corresponding to an arrangement of the plurality of pixels in the respective pixel block, without distinguishing the normal pixel and the pixel for phase difference detection from each other.

3. The solid-state image pickup element according to claim 1, wherein
the circuitry is further configured to read out, after the normal pixel and the pixel for phase difference detection are distinguished from each other, a first pixel signal of one of the normal pixel or the pixel for phase difference detection in an order corresponding to an arrangement of the plurality of pixels in the respective pixel block, and
the read out of the first pixel signal of the one of the normal pixel or the pixel for phase difference detection is subsequent to read out of a second pixel signal of the other of the normal pixel or the pixel for phase difference detection.

4. The solid-state image pickup element according to claim 1, wherein the circuitry is further configured to read out the pixel signals of the plurality of pixels of the first pixel block in an order corresponding to the plurality of pixels of the second pixel block.

5. The solid-state image pickup element according to claim 1, wherein the pixel for phase difference detection of a third pixel block of the plurality of pixel blocks and the pixel for phase difference detection of a fourth pixel block of the plurality of pixel blocks are arranged in positions common between the third pixel block and the fourth pixel block.

6. The solid-state image pickup element according to claim 4, wherein an order of AD conversion of the pixel signals of the plurality of pixels of each of a third pixel block of the plurality of pixel blocks and a fourth pixel block of the plurality of pixel blocks is common among the third pixel block and the fourth pixel block.

7. The solid-state image pickup element according to claim 4, wherein an order of AD conversion of the pixel signals of the plurality of pixels of a third pixel block of the plurality of pixel blocks is different from an order of AD conversion of the pixel signals of the plurality of pixels of a fourth pixel block of the plurality of pixel blocks.

8. The solid-state image pickup element according to claim 1, further comprising:
a first substrate that includes the pixel array; and
a second substrate that includes the plurality of AD converters,
wherein the first substrate is on the second substrate.

9. The solid-state image pickup element according to claim 1, wherein the pixel for phase difference detection is configured to produce the pixel signal to control phase difference detection auto focus.

10. The solid-state image pickup element according to claim 1, wherein
the plurality of pixels further includes a plurality of pixels for phase difference detection, and
the plurality of pixels for phase difference detection in the respective pixel block is arranged in a transverse direction.

11. The solid-state image pickup element according to claim 1, wherein
the plurality of pixels further includes a plurality of pixels for phase difference detection, and
the plurality of pixels for phase difference detection in the respective pixel block is arranged in a longitudinal direction.

12. The solid-state image pickup element according to claim 1, wherein
the plurality of pixels further includes a plurality of pixels for phase difference detection, and
the plurality of pixels for phase difference detection in the respective pixel block is arranged in an oblique direction.

13. The solid-state image pickup element according to claim 1, wherein the pixel for phase difference detection is configured to serve as the normal pixel.

14. An electronic apparatus, comprising:
a solid-state image pickup element that includes:
a pixel array that comprises a plurality of pixel blocks, wherein
each of the plurality of pixel blocks comprises a plurality of pixels, and
the plurality of pixels includes a normal pixel and a pixel for phase difference detection;
a plurality of Analog-Digital (AD) converters,
wherein each of the plurality of AD converters corresponds to a respective pixel block of the plurality of pixel blocks; and
circuitry configured to:
read out pixel signals of the plurality of pixels of each pixel block of the plurality of pixel blocks; and
supply the pixel signals of the plurality of pixels of each pixel block of the plurality of pixel blocks to a corresponding AD converter of the plurality of AD converters, wherein
each of the plurality of AD converters is configured to AD-convert the pixel signals of the plurality of pixels of the respective pixel block,
the pixel for phase difference detection of a first pixel block of the plurality of pixel blocks and the pixel for phase difference detection of a second pixel block of the plurality of pixel blocks are arranged in different positions in the first pixel block and the second pixel block, respectively, and
an order of AD conversion of a pixel signal of the pixel for phase difference detection of each of the first pixel block and the second pixel block is common among the first pixel block and the second pixel block.

* * * * *